(12) United States Patent
Kato et al.

(10) Patent No.: US 7,586,163 B2
(45) Date of Patent: Sep. 8, 2009

(54) SEMICONDUCTOR DEVICE HAVING AN ELECTRODE CONTAINING BORON AND MANUFACTURING METHOD THEREOF

(75) Inventors: Koichi Kato, Yokohama (JP); Daisuke Matsushita, Hiratsuka (JP); Koichi Muraoka, Sagamihara (JP); Yasushi Nakasaki, Yokohama (JP); Yuichiro Mitani, Kanagawa-Ken (JP); Nobutoshi Aoki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 284 days.

(21) Appl. No.: 11/287,192

(22) Filed: Nov. 28, 2005

(65) Prior Publication Data
US 2006/0278940 A1    Dec. 14, 2006

(30) Foreign Application Priority Data
Jun. 13, 2005    (JP) .............................. 2005-172667

(51) Int. Cl.
*H01L 29/76* (2006.01)

(52) U.S. Cl. .............................. 257/410; 257/E29.132; 257/E29.162

(58) Field of Classification Search ................. 257/410, 257/411, E29.132, E29.162
See application file for complete search history.

(56) References Cited

U.S. PATENT DOCUMENTS 7,119,016 B2 * 10/2006 Chakravarti et al. ......... 438/680
2006/0084247 A1 * 4/2006 Liu .............................. 438/510

FOREIGN PATENT DOCUMENTS

JP    2002-063117    2/2002

* cited by examiner

*Primary Examiner*—Matthew E Warren
(74) *Attorney, Agent, or Firm*—Finnegan, Henderson, Farabow, Garrett & Dunner, L.L.P.

(57) ABSTRACT

A semiconductor device includes a semiconductor substrate; an insulation film provided on the semiconductor substrate; and an electrode provided on the insulation film, and containing boron and a semiconductor material, wherein at least one element of the group V and carbon is introduced into an interface between the insulation film and the electrode.

11 Claims, 10 Drawing Sheets

SEMICONDUCTOR DEVICE HAVING AN ELECTRODE CONTAINING BORON AND MANUFACTURING METHOD THEREOF

CROSS-REFERENCE TO RELATED APPLICATION

This application is based upon and claims the benefit of priority from the prior Japanese Patent Applications No. 2005-172667, filed on Jun. 13, 2005, the entire contents of which are incorporated herein by reference.

BACKGROUND OF THE INVENTION

1. Field of the Invention

The present invention relates to a semiconductor device and a method of manufacturing the semiconductor device.

2. Background Art

A semiconductor oxide film has an important role as a gate insulation film in various kinds of semiconductor devices. In recent years, along progress of miniaturization of semiconductor elements, a thermally-oxidized film becomes increasingly thinner as a gate insulation film. In recent years, as the miniaturization of semiconductor elements has advanced, thermally-oxidized films serving as gate insulation films have become increasingly thinner. However, when the film thickness of a thermally-oxidized film becomes two nanometers or less, a current that passes through the thermally-oxidized film increases. An increase in the tunnel current brings about a phenomenon that an impurity such as boron contained in a gate electrode is caused to pass through the thermally-oxidized film and diffuses. Therefore, when the gate insulation film has a thin thickness of two nanometers or smaller, it is difficult to improve the performance of the semiconductor elements.

In order to overcome such a difficulty, a high-k gate insulation film produced by mixing nitrogen or metal into such an oxide film can be used. When nitrogen atoms or metal atoms are introduced into an oxide film, the dielectric constant of the gate insulation film is increased. Therefore, even when the gate insulation film has a large physical film thickness, an equivalent oxide thickness (EOT) of the gate insulation film can be made smaller. In other words, when a gate insulation film having a high dielectric constant is used, the thickness of the gate insulation film can be increased as compared to an ordinary oxide film having the same capacitance. With this structure, a current that leaks through the gate insulation film is decreased, and diffusion of impurity can be suppressed (Japanese Patent Application Laid-open No. 2002-63117).

However, when a P-type polysilicon electrode containing boron is formed on the gate insulation film having a higher dielectric constant than the oxide film, a flat band voltage Vfb and a threshold voltage Vth shift in accordance with the amount of nitrogen contained in the gate insulation film. Furthermore, a current flowing through a channel area immediately below the gate insulation film is scattered, thereby decreasing a drive current capability of the semiconductor elements. Furthermore, a leak current that tunnels through the gate insulation film is increased.

SUMMARY OF THE INVENTION

An advantage of an aspect of the present invention is to provide a semiconductor device having high reliability and a stable characteristic and a method of manufacturing this semiconductor device.

A semiconductor device according to an embodiment of the present invention comprises a semiconductor substrate; an insulation film provided on the semiconductor substrate; and an electrode provided on the insulation film, and containing boron and a semiconductor material, wherein at leaset one element of the group V and carbon is introduced into an interface between the insulation film and the electrode.

A method of manufacturing a semiconductor device according to an embodiment of the present invention comprises forming an insulation film on a semiconductor substrate; depositing at least one element of the group V and carbon on the insulation film, or implanting at least one element of the group V and carbon into the insulation film; and forming an electrode containing boron and a semiconductor material on the insulation film.

DETAILED DESCRIPTION OF THE INVENTION

As a result of dedicated researches, the inventors of the present invention have found the causes of the problems of the shifting of the flat band voltage Vfb and the threshold voltage Vth. The causes are explained below.

When a P-type polysilicon electrode containing boron is formed on a gate insulation film consisting of a SiON film in a P-type MOSFET (Metal-Oxide-Semiconductor Field Effect Transistor), the boron contained in the polysilicon electrode diffuses into the gate insulation film due to an annealing process. The boron breaks a bond of silicon and nitrogen in the gate insulation film, and forms bonds with nitrogen. As a result, a dangling bond occurs in silicon in the gate insulation film. This dangling bond becomes a fixed charge, and a defect level is formed. Consequently, this causes a problem arises in that the flat band voltage Vfb and the threshold voltage Vth shift. The defect level in the gate insulation film causes a scattering of the current that flows through the channel area immediately below the gate insulation film. Therefore, the defect level deteriorates the drive current capability of the semiconductor elements. Furthermore, due to the defect level in the gate insulation film, a leak current that tunnels through the gate insulation film is increased.

As explained above, it becomes clear that the boron diffusing into the polysilicon electron breaks a bond of silicon and nitrogen and generates a dangling bond, and the dangling bond causes a defect level as a result.

The inventors of the present invention have found that the above problems can be overcome by preventing boron in the electrode from diffusing into the insulation film.

Embodiments of the present invention will be explained below with reference to the accompanying drawings. The present invention is not limited by the embodiments.

FIRST EMBODIMENT

Figure 1:
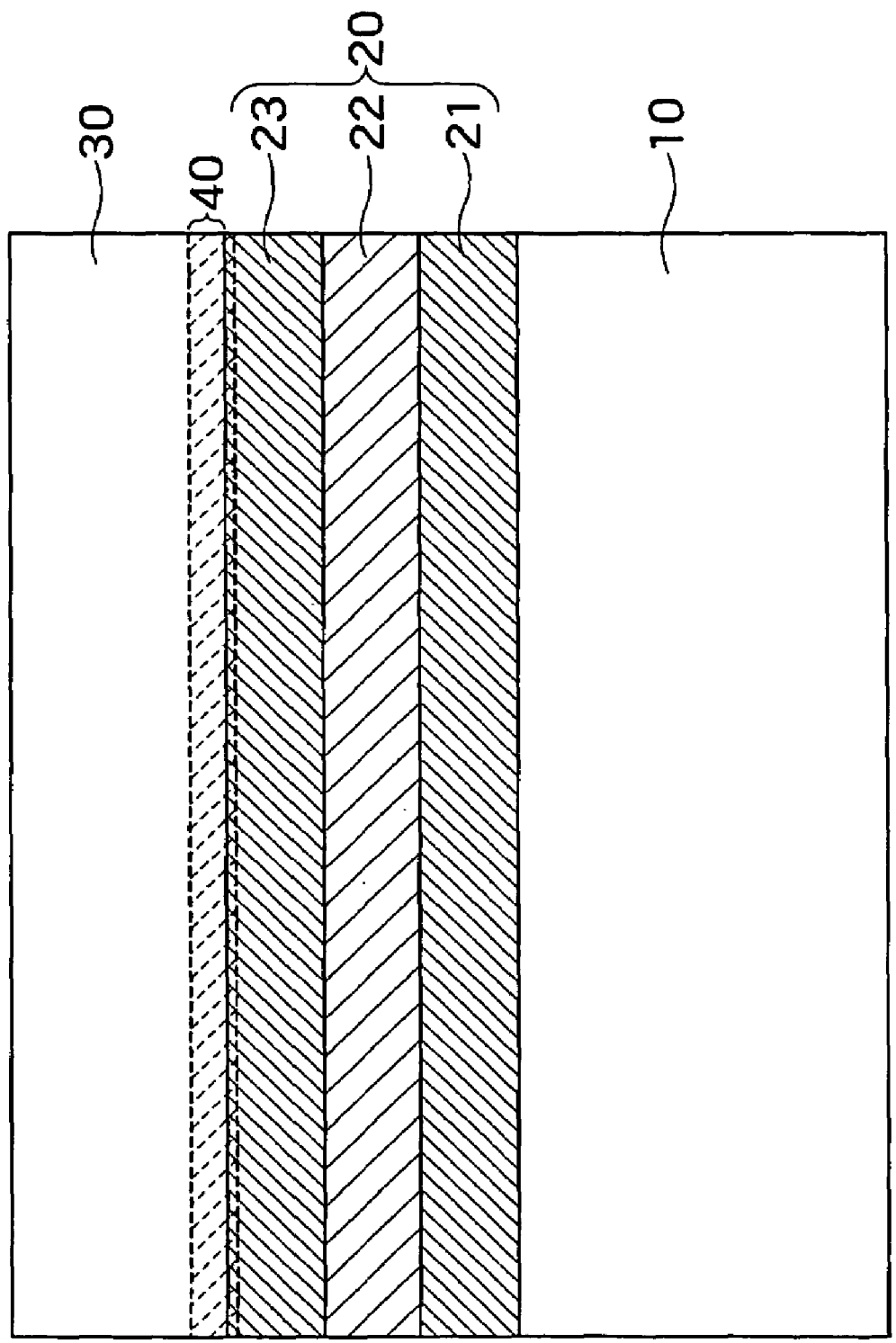
FIG. 1 is a partial cross-sectional view of a P-type MOS transistor 100 according to a first embodiment of the present invention.

FIG. 1 is a partial cross-sectional view of a P-type MOS transistor 100 (hereinafter, referred to as "transistor 100") according to a first embodiment of the present invention. The transistor 100 includes a semiconductor substrate 10, a gate insulation film 20, and a gate electrode 30.

The semiconductor substrate 10 is a silicon substrate or SOI (Silicon On Insulator) substrate, for example. The semiconductor substrate 10 can be a semiconductor substrate containing gallium, arsenic, or germanium. The gate insulation film 20 is provided on the semiconductor substrate 10. The gate insulation film 20 can be an insulation film containing any one of a nitrogen atom, an oxygen atom, a transition element, and a rare earth element. For example, the gate insulation film 20 can be any one of a silicon oxide film, a silicon nitride film, a silicon oxynitride film, a silicon oxide film containing a transition element (hafnium, for example), a silicon oxide film containing a rare earth element (lanthanum, for example), a silicon oxynitride film containing a transition element, a silicon oxynitride film containing a rare earth element, silicate, and aluminate. In FIG. 1, the silicon oxynitride film 20 including a silicon oxide film 21, a silicon nitride film 22, and a silicon oxide film 23 is shown. In the present embodiment, the silicon oxynitride film 20 is an ONO film formed by laminating three layers including the silicon oxide film 21, the silicon nitride film 22, and the silicon oxide film 23. The silicon oxynitride film 20 can be also a single SiON layer.

The gate electrode 30 is provided on the gate insulation film 20. The gate electrode 30 contains boron and a semiconductor material. For example, the gate electrode 30 can be a doped polysilicon containing boron.

Furthermore, any one of elements of the group V (phosphorus, arsenic, antimony, or bismuth, etc) and carbon, or a combination of two or more kinds of elements of the group V and carbon is introduced into an interface 40 between the gate insulation film 20 and the gate electrode 30. Any one of elements of the group V and carbon, or a combination of two or more kinds of elements of the group V and carbon is introduced into the interface 40 in a concentration of $10^{18} cm^{-3}$ or above. The concentration is equal to $10^{12} cm^{-2}$ or more in a surface concentration. With this arrangement, the effect of the present embodiment can be properly exhibited. The combination of two or more kinds of elements of the group V and carbon is a combination of carbon and phosphorus, for example. The interface 40 indicates an area where phosphorus and the like are introduced between the gate insulation film 20 and the gate electrode 30.

A method of manufacturing the transistor 100 is explained next. In the present embodiment, the silicon substrate 10 is used as the semiconductor substrate 10, the silicon oxynitride film 20 is used as the gate insulation film 20, and the doped polysilicon 30 is used as the gate electrode 30. In the present embodiment, phosphorus is introduced into the interface 40.

Figure 2:
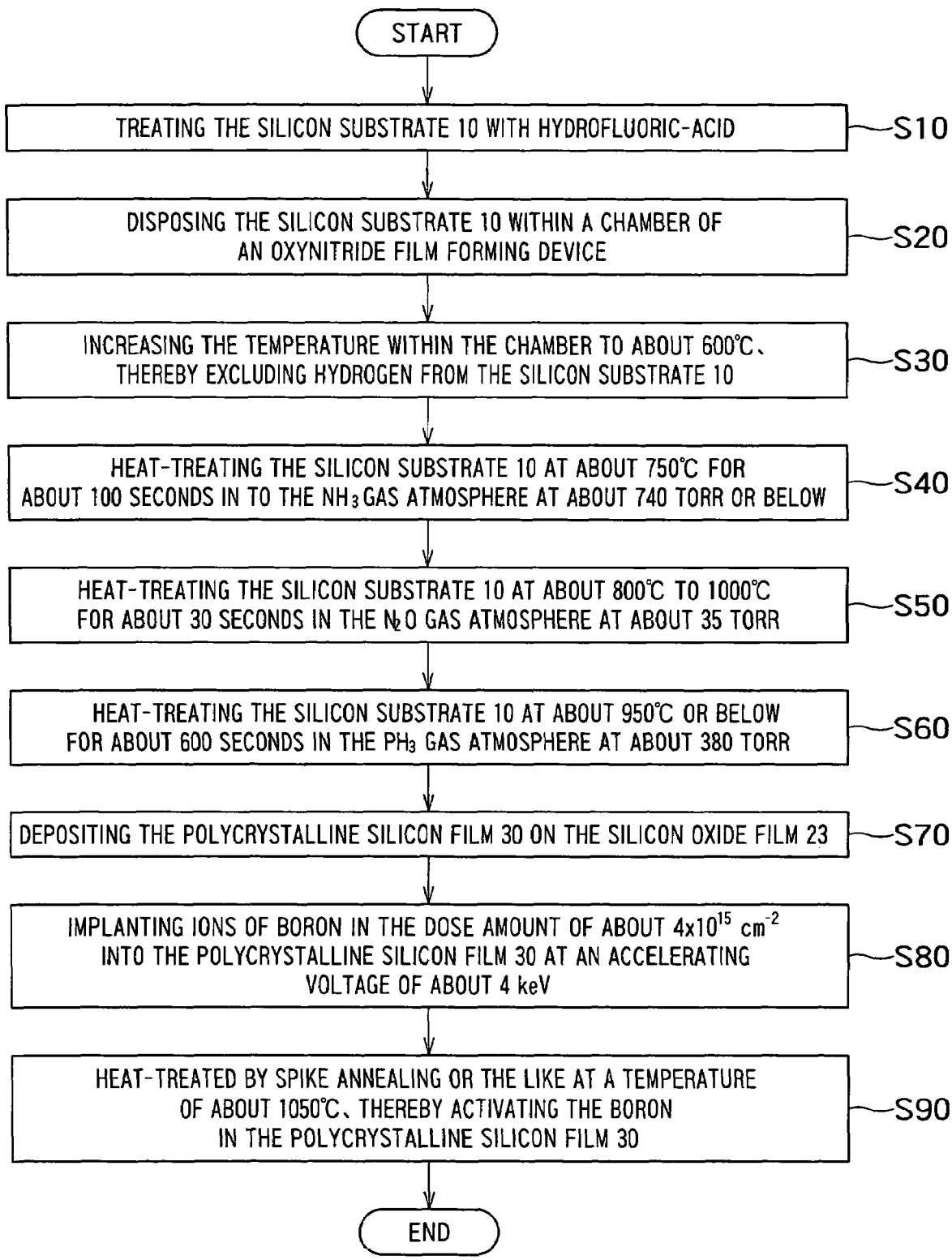
FIG. 2 is a flowchart showing the method of manufacturing the transistor 100.
Figure 3:
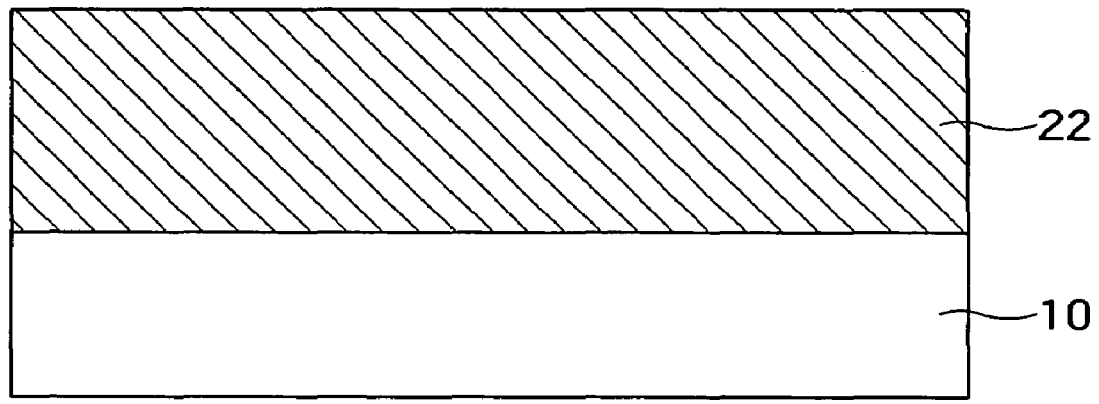
FIG. 3 and FIG. 4 are cross-sectional views showing the flow of the manufacturing method.
Figure 4:
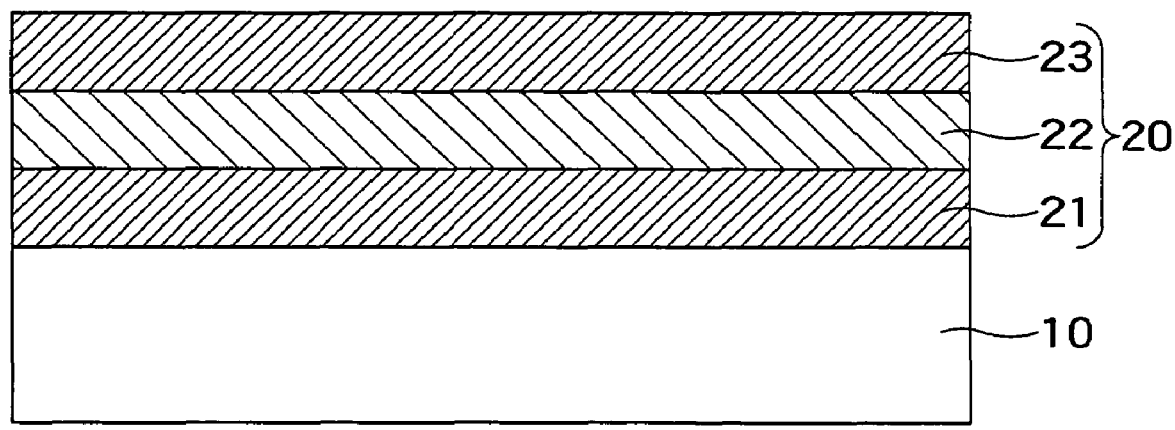

FIG. 2 is a flowchart showing the method of manufacturing the transistor 100. FIG. 3 and FIG. 4 are cross-sectional views showing the flow of the manufacturing method.

First, the silicon substrate 10 having a (100) surface as a main surface is hydrofluoric-acid treated (S10). Accordingly, the main surface of the silicon substrate 10 is terminated with hydrogen.

Next, the silicon substrate 10 is disposed within a chamber of an oxynitride film forming device not shown in the drawings (S20). The oxynitride film forming device includes a susceptor on which plural semiconductor substrates are mounted, and a chamber having an annealing furnace. This chamber has a $N_2$ gas supply source, a $NH_3$ gas supply source, a $N_2O$ gas supply source, a $PH_3$ gas supply source, a $SiH_4$ gas supply source, a gas inlet, and a gas outlet. A valve is fitted to each of the $N_2$ gas supply source, the $NH_3$ gas supply source, the $N_2O$ gas supply source, the $PH_3$ gas supply source, and the $SiH_4$ gas supply source, thereby controlling a gas partial pressure within the chamber. A heater is disposed around the heating furnace, thereby controlling the temperature within the chamber.

The silicon substrate 10 is mounted on the susceptor. Next, $N_2$ gas is introduced into the chamber at a room temperature. The temperature within the chamber is increased to about 600° C. with the heater of the heating furnace, thereby desorbing hydrogen from the silicon substrate 10 (S30).

Next, $NH_3$ gas is introduced into the chamber, and the silicon substrate 10 is heat treated at about 750° C. for about 100 seconds in the $NH_3$ gas atmosphere at about 740 Torr or below (S40). Accordingly, the silicon nitride film 22 is formed on the main surface of the silicon substrate 10 as shown in FIG. 3.

Next, $N_2O$ gas is introduced into the chamber, and the silicon substrate 10 is heat treated at about 800° C. to 1,000° C. for about 30 seconds in the $N_2O$ gas atmosphere at about 35 Torr (S50). Accordingly, the silicon oxide film 21 is formed between the silicon nitride film 22 and the silicon substrate 10 as shown in FIG. 4. At the same time, the silicon oxide film 23 is formed on the surface of the silicon nitride film 22.

Next, $PH_3$ gas is introduced into the chamber, and the silicon substrate 10 is heat treated at about 950° C. or below for about 600 seconds in the $PH_3$ gas atmosphere at about 380 Torr (S60). Accordingly, phosphorus is deposited on the silicon nitride film 23.

Furthermore, the polysilicon film 30 having a film thickness of about 150 nm is deposited on the silicon oxide film 23 (S70). Accordingly, phosphorus is deposited on the interface 40 between the silicon oxide film 23 and the polysilicon film 30, as shown in FIG. 1. Phosphorus has a characteristic of being easily segregated in polysilicon than in the silicon oxynitride film. Therefore, as shown in the interface 40 in FIG. 1, there is more phosphorus in the polysilicon film 30 than in the silicon oxynitride film 20.

The silicon substrate 10 is taken out of the chamber. Next, ions of boron in the dose amount of about $4 \times 10^{15} cm^{-2}$ are implanted into the polysilicon film 30 at an accelerating voltage of about 4 keV in the ion implantation process (S80). Furthermore, the result is heat treated by spike annealing or the like at a temperature of about 1,050° C., thereby activating the boron in the polysilicon film 30 (S90).

The heat treating intended to activate boron not only simply activates the boron, but also in the polysilicon film 30, and diffuses inactive floating boron to the gate insulation film 20 as an interstitial atom. However, boron that is about to diffuse toward the gate insulation film 20 is bonded with phosphorus contained in the interface 40, thereby forming a stable inactive structure. Accordingly, the diffusion of boron to the gate insulation film 20 is suppressed. Accordingly, a variation in the flat band voltage Vfb and the threshold voltage Vth can be suppressed.

Behaviors of boron and phosphorus in the polysilicon film 30 according to the present embodiment and effects due to the present embodiment are explained below.

Figure 5B:
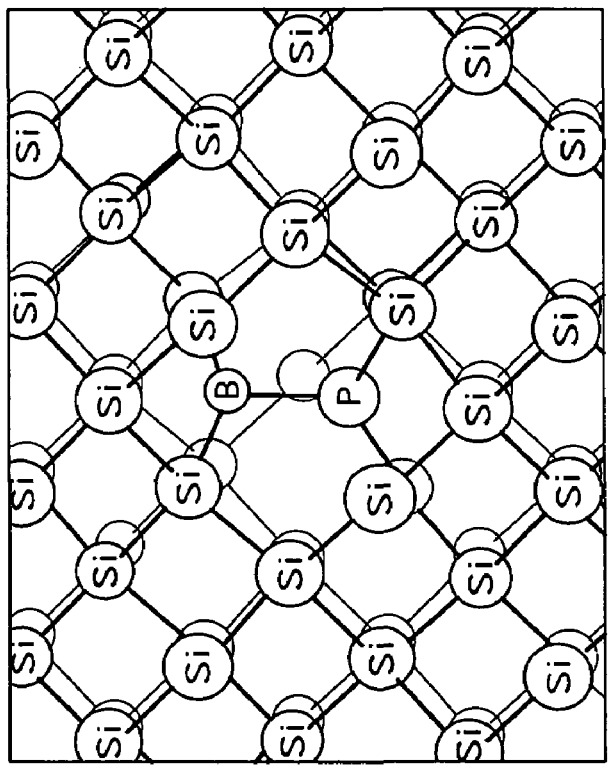
FIG. 5B is a diagram of a crystal structure when boron diffuses in the crystal structure shown in FIG. 5A.
Figure 5A:
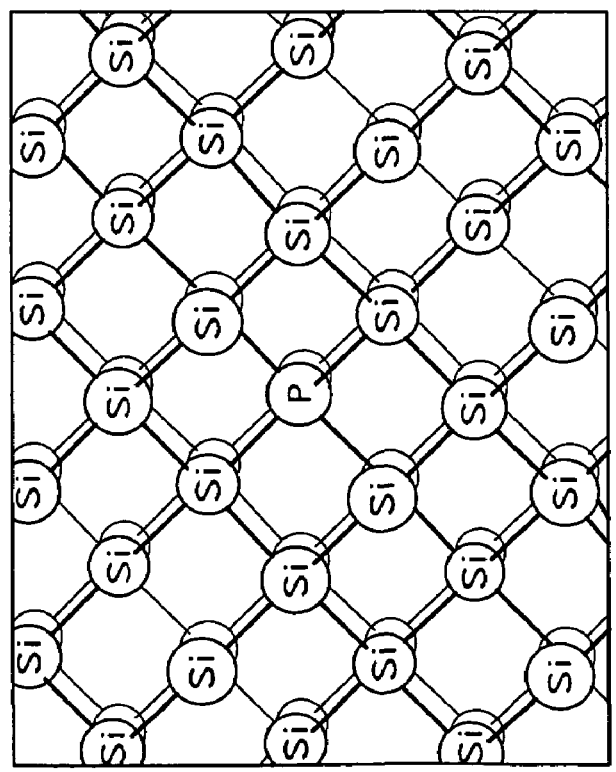
FIG. 5A shows a crystal structure of the polysilicon 30 containing phosphorus.

FIG. 5A is a crystal structure of the polysilicon 30 containing phosphorus. As shown in FIG. 5A, one phosphorus atom is bonded with four silicon atoms. Therefore, no dangling bond exists in the silicon atom. Accordingly, phosphorus is present relatively more stably in the polysilicon film 30 than in the silicon oxynitride film 20. Accordingly, phosphorus is segregated in the polysilicon film 30 as shown in FIG. 1.

FIG. 5B is a diagram of a crystal structure when boron atoms diffuse in the crystal structure shown in FIG. 5A. When boron atoms diffuse in the crystal structure shown in FIG. 5A, a boron atom is bonded with a phosphorus atom and two silicon atoms. According to a simulation, the bond between the boron atom and the phosphorus atom is strong, and the energy gain is about 3.88 eV. This energy gain is larger than a maximum energy gain (about 2.61 eV) that is obtained by boron in a silicon crystal. Therefore, when boron is diffusing to the silicon oxynitride film 20 in FIG. 1, the boron is caused to be strongly bonded with phosphorus at the interface 40 between the polysilicon film 30 and the silicon oxynitride film 20. Consequently, boron is captured at the interface 40, and the diffusion of boron to the silicon oxynitride film 20 can be suppressed.

Figure 6:
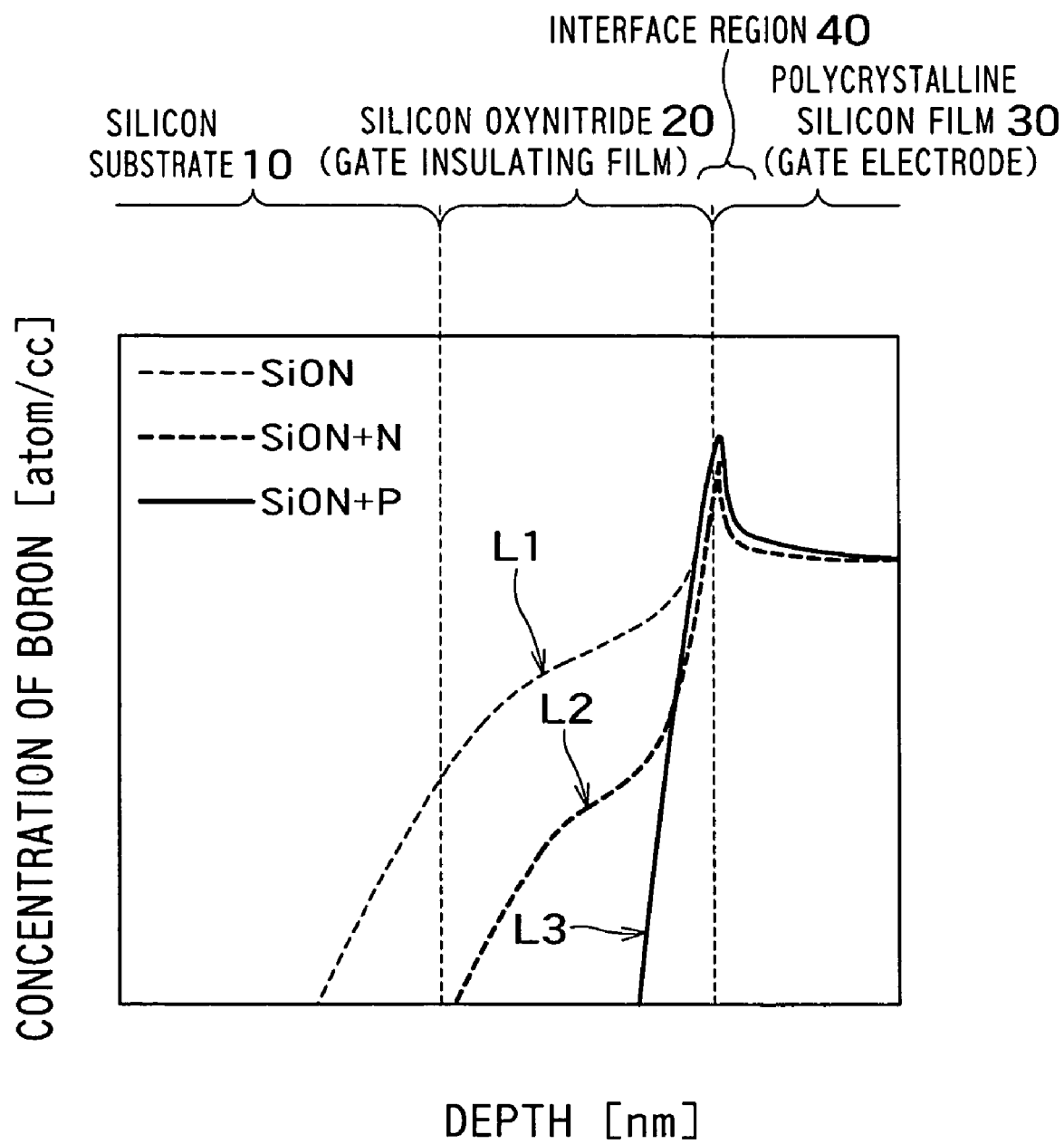
FIG. 6 is a graph showing a concentration of boron near the silicon oxynitride film 20.

FIG. 6 is a graph showing a concentration of boron near the silicon oxynitride film 20. The horizontal axis represents a depth in the direction perpendicular to the main surface of the silicon substrate 10. The vertical axis represents a concentration of boron. This graph is obtained as a result of carrying out a secondary ion mass spectrometry (SIMS) analysis.

A curve L1 expresses a concentration of boron when a conventional silicon oxynitride film is used. A curve L2 expresses a concentration of boron when a silicon oxynitride film is used, which has a high-concentration nitrogen area on the surface by depositing nitrogen. A curve L3 expresses a concentration of boron when a silicon oxynitride film having the interface 40 containing phosphorus is used by depositing phosphorus. The physical film thickness of the silicon oxynitride films represented by the curves L1 to L3, respectively is 1.6 nm. The curve L3 shows a characteristic of the transistor 100 according to the present embodiment.

It is clear from the curve L1 that boron not only diffuses in the silicon oxynitride film 20 but also reaches the silicon substrate 10 by passing through the silicon oxynitride film 20. Accordingly, the flat band voltage Vfb and the threshold voltage Vth vary to a large extent.

It is clear from the curve L2 that boron stays in the silicon oxynitride film 20, and does not reach the silicon substrate 10. However, the diffusion of boron to the inside of the silicon oxynitride film 20 cannot be suppressed.

It is clear from the curve L3 that the diffusion of boron to the inside of the silicon oxynitride film 20 is suppressed. In other words, the transistor 100 according to the present embodiment can suppress boron from diffusing to the silicon oxynitride film 20 by introducing phosphorus into the interface 40 between the silicon oxynitride film 20 and the polysilicon film 30, even when a thin silicon oxynitride film having a physical film thickness of 1.6 nm is used.

Figure 7:
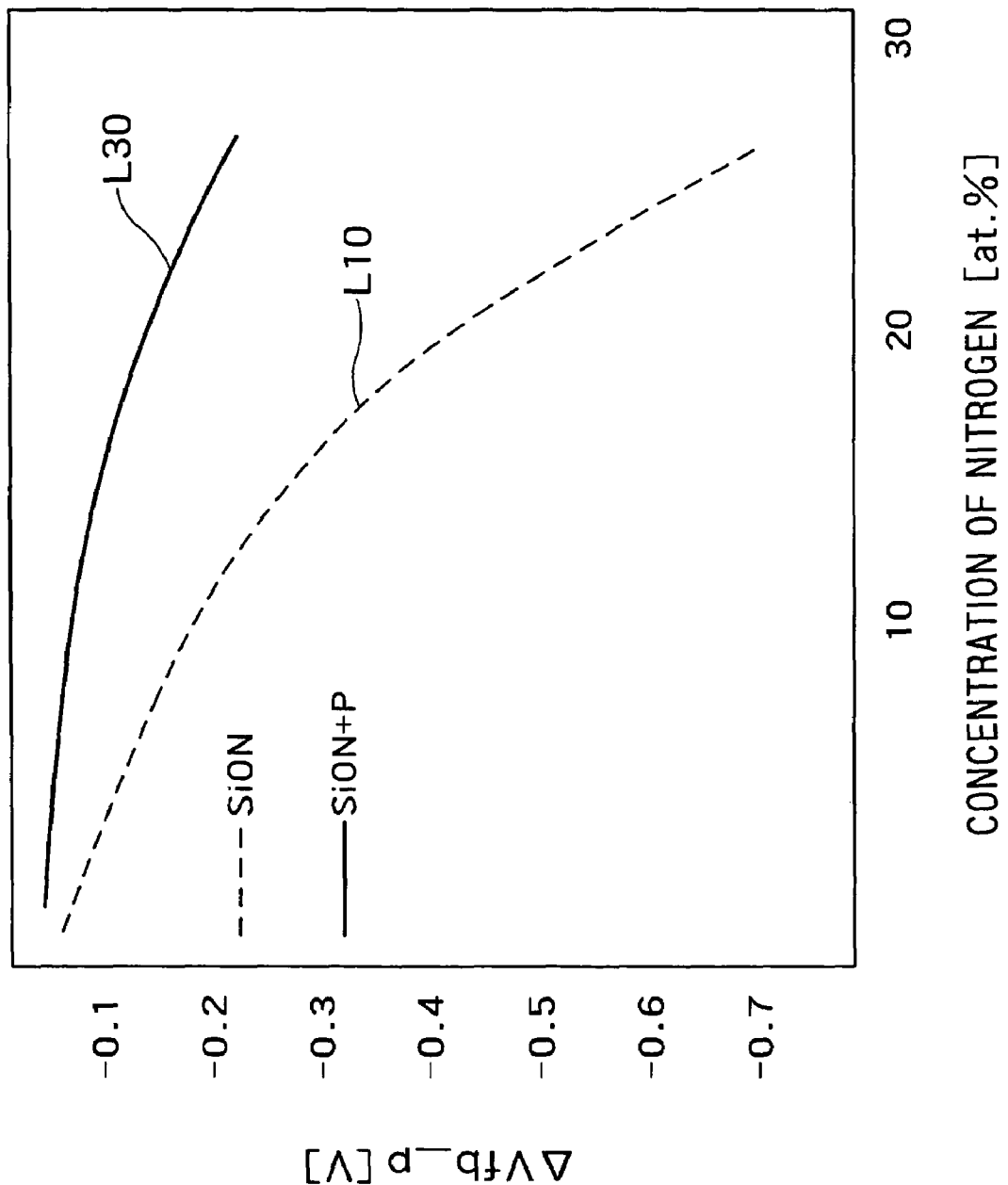
FIG. 7 is a graph showing a relationship between the concentration of boron in the silicon oxynitride film 20 and a variation $\Delta Vfb$ in the flat band voltage.

FIG. 7 is a graph showing a relationship between a concentration of nitrogen in the silicon oxynitride film 20 and a variation $\Delta Vfb$ in the flat band voltage. A curve L10 expresses a concentration of nitrogen when a conventional silicon oxynitride film is used. A curve L30 expresses a concentration of nitrogen when a silicon oxynitride film having the interface 40 containing phosphorus is used. The physical film thickness of the silicon oxynitride films corresponding to the curves L10 and L30, respectively is 1.6 nm. The curve L30 shows a characteristic of the transistor 100 according to the present embodiment.

It is clear from the curve L10 that when the concentration of nitrogen in the silicon oxynitride film 20 is increased, the flat band voltage Vfb varies to a large extent.

It is clear from the curve L30 that even when the concentration of nitrogen in the silicon oxynitride film 20 is increased, the flat band voltage Vfb stays relatively stably. The reason for this is that because boron is bonded with phosphorus contained in the interface 40, the diffusion of boron to the silicon oxynitride film 20 is suppressed. Accordingly, the concentration of nitrogen in the silicon oxynitride film 20 can be increased further.

According to the first embodiment, phosphorus is deposited on the surface of the silicon oxynitride film 20 at step S60. Alternatively, ions of phosphorus can be implanted after the polysilicon film 30 is formed at step S70. Alternatively, ions of phosphorus can be implanted into the polysilicon film 30 after step S70, and thereafter, boron can be further ion implanted into the polysilicon film 30 at step S80.

According to the first embodiment, ions of boron are implanted into the polysilicon film 30 (step S80). Alternatively, boron can be contained in the deposition gas for depositing polysilicon at step S70, resulting in that the polysilicon film 30 including boron may be grown by vapor phase epitaxy.

According to the first embodiment, phosphorus is introduced into the interface 40 between the silicon oxynitride film 20 and the polysilicon film 30. Alternatively, instead of phosphorus, any one of elements of the group V (arsenic, antimony, or bismuth) and carbon, or a combination of two or more kinds of elements of the group V and carbon can be introduced into the interface 40. In the case of introducing arsenic, arsine gas can be used at step S60. In the case of introducing antimony, stibine gas can be used at step S60. In the case of introducing bismuth, hydrogenated bismuth gas can be used at step S60. In the case of introducing carbon, methane gas can be used at step S60.

According to the first embodiment, due to phosphorus that is introduced into the interface 40 between the gate insulation film 20 and the gate electrode 30, the diffusion of boron from the gate electrode 30 to the gate insulation film 20 can be suppressed. Accordingly, a variation in the flat band voltage Vfb and a variation in the threshold voltage Vth can be suppressed. Accordingly, the transistor 100 can have a highly reliable and stable characteristic.

SECOND EMBODIMENT

According to a second embodiment, carbon is introduced into the interface 40 between the gate insulation film 20 and the gate electrode 30. Other features of the second embodiment are similar to those of the first embodiment. A cross-sectional configuration of the transistor according to the second embodiment is similar to that shown in FIG. 1, and, therefore, this configuration diagram is omitted.

Figure 8:
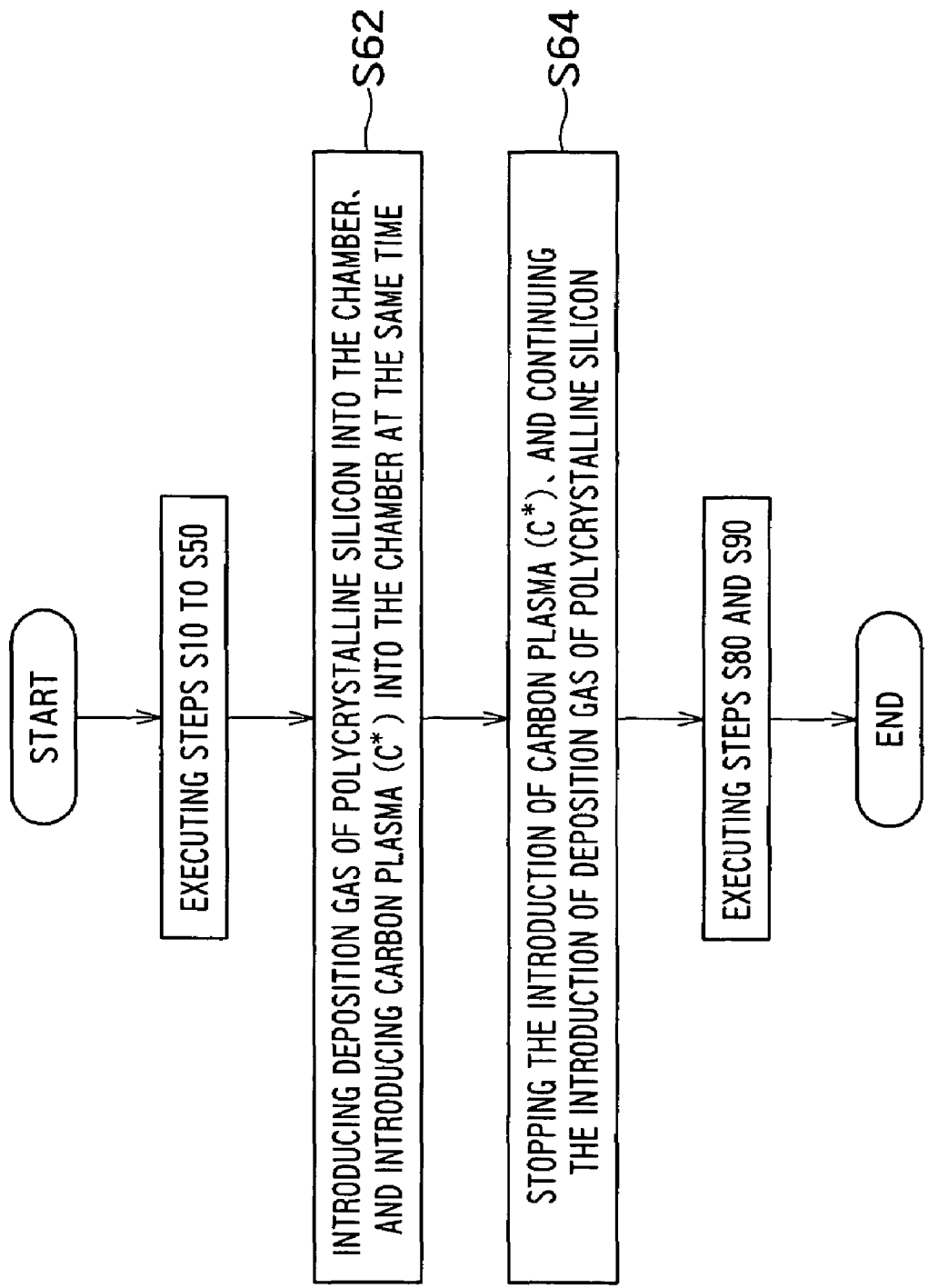
FIG. 8 is a flowchart showing a method of manufacturing a transistor according to a second embodiment.

FIG. 8 is a flowchart showing a method of manufacturing the transistor according to the second embodiment. The method of manufacturing the transistor according to the second embodiment is explained with reference to FIG. 1 to FIG.

4 and FIG. 9. First, processing at steps S10 to S50 shown in FIG. 2 is executed to obtain the configuration shown in FIG. 4.

Thereafter, deposition gas for depositing polysilicon is introduced into the chamber, and carbon plasma (C*) is introduced into the chamber at the same time (S62). Consequently, polysilicon having a film thickness of about one nm containing carbon in the concentration of about $10^{20}$ cm$^{-3}$ is formed. Then, the introduction of carbon plasma (C*) is stopped, and the introduction of deposition gas for depositing polysilicon is continued (S64). Accordingly, a polysilicon film having a film thickness of about 150 nm containing no carbon is formed.

Next, processing at steps S80 and S90 shown in FIG. 2 is executed.

Behaviors of boron and carbon in the polysilicon film 30 according to the present embodiment and effects due to the present embodiment are explained below.

Figure 9B:
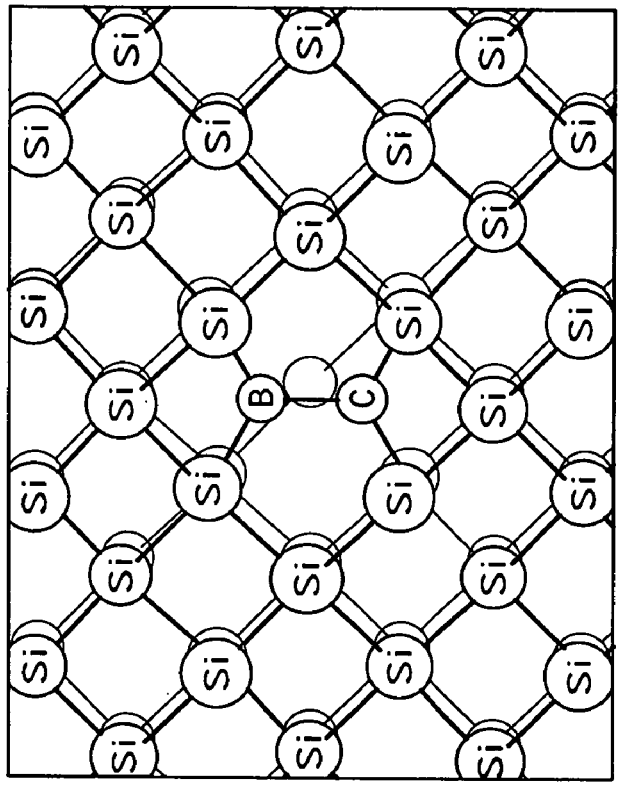
FIG. 9B is a diagram of a crystal structure when boron diffuses in the crystal structure shown in FIG. 9A.
Figure 9A:
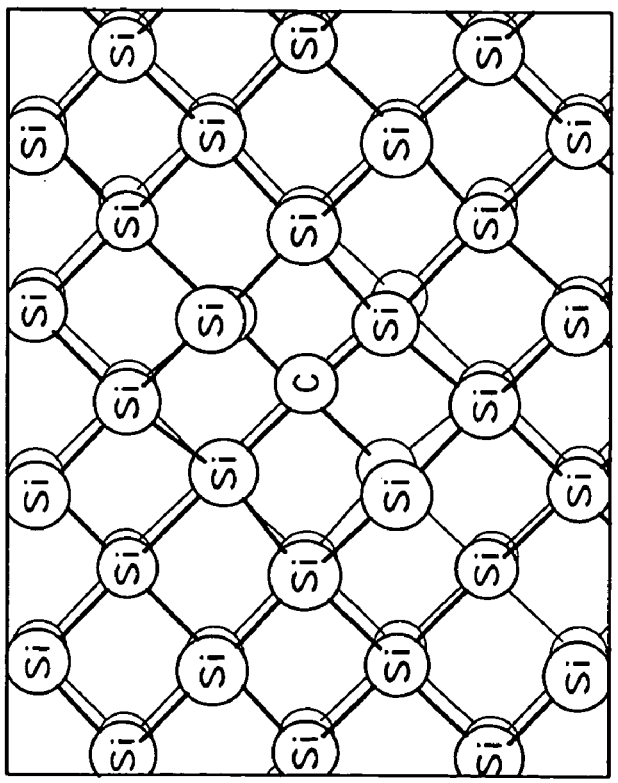
FIG. 9A shows a crystal structure of the polysilicon 30 containing carbon.

FIG. 9A is a crystal structure of the polysilicon 30 containing carbon. As shown in FIG. 9A, one carbon atom is bonded with four silicon atoms. Therefore, no dangling bondarise in the silicon atom. Accordingly, carbon is present relatively more stably in the polysilicon film 30 than in the silicon oxynitride film 20. Accordingly, carbon is segregated in the polysilicon film 30 as shown at the interface 40 in FIG. 1.

FIG. 9B is a diagram of a crystal structure when boron atoms diffuse in the crystal structure shown in FIG. 9A. When boron atoms diffuse in the crystal structure shown in FIG. 9A, a boron atom is bonded with a carbon atom and two silicon atoms. According to a simulation, the bond between the boron and the carbon atom is strong, and the energy gain is about 4.67 eV. This energy gain is larger than a maximum energy gain (about 2.61 eV) that is obtained by boron in a silicon crystal. Therefore, when boron is diffusing to the silicon oxynitride film 20 in FIG. 1, the boron is caused to be strongly bonded with carbon at the interface 40 between the polysilicon film 30 and the silicon oxynitride film 20. Consequently, the diffusion of boron to the silicon oxynitride film 20 can be suppressed.

Figure 10:
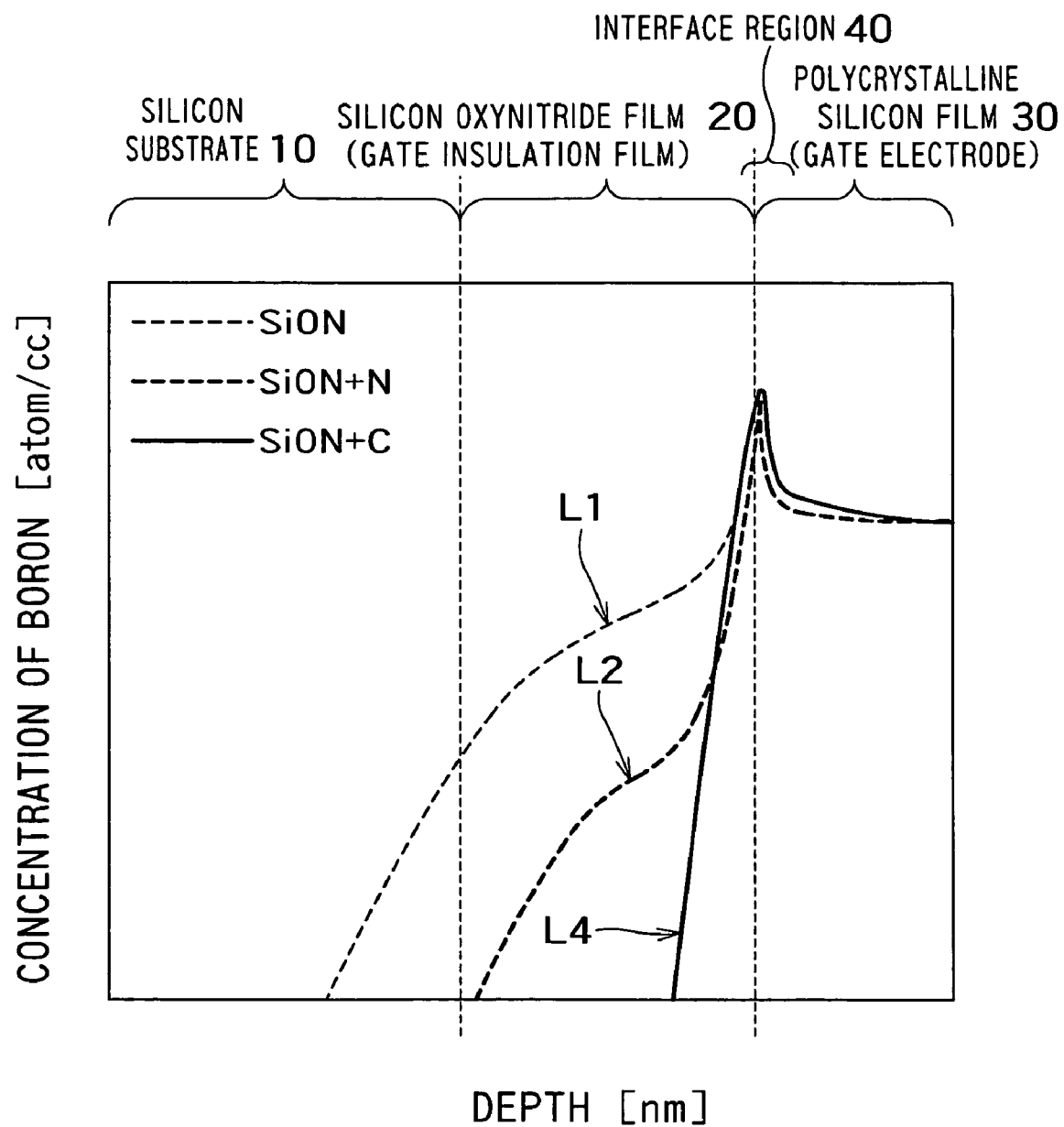
FIG. 10 is a graph showing a concentration of boron near the silicon oxynitride film 20.

FIG. 10 is a graph showing a concentration of boron near the silicon oxynitride film 20. The horizontal axis represents a depth in the direction perpendicular to the main surface of the silicon substrate 10. The vertical axis represents a concentration of boron. This graph is obtained as a result of carrying out an SIMS analysis.

The curves L1 and L2 are similar to those shown in FIG. 6. A curve L4 expresses a concentration of boron when a silicon oxynitride film is used, which has the interface 40 containing carbon by depositing carbon. The physical film thickness of the silicon oxynitride films represented by the curves L1, L2, and L4, respectively is 1.6 nm. The curve L4 shows a characteristic of the transistor according to the second embodiment.

Because the curves L1 and L2 are similar to those according to the first embodiment, explanation of the curves L1 and L2 is omitted.

It is clear from the curve L4 that the diffusion of boron to the inside of the silicon oxynitride film 20 is suppressed. In other words, the transistor according to the present embodiment can suppress boron from diffusing to the silicon oxynitride film 20 by introducing carbon into the interface 40 between the silicon oxynitride film 20 and the polysilicon film 30, even when a thin silicon oxynitride film having a the physical film thickness of 1.6 nm is used.

Figure 11:
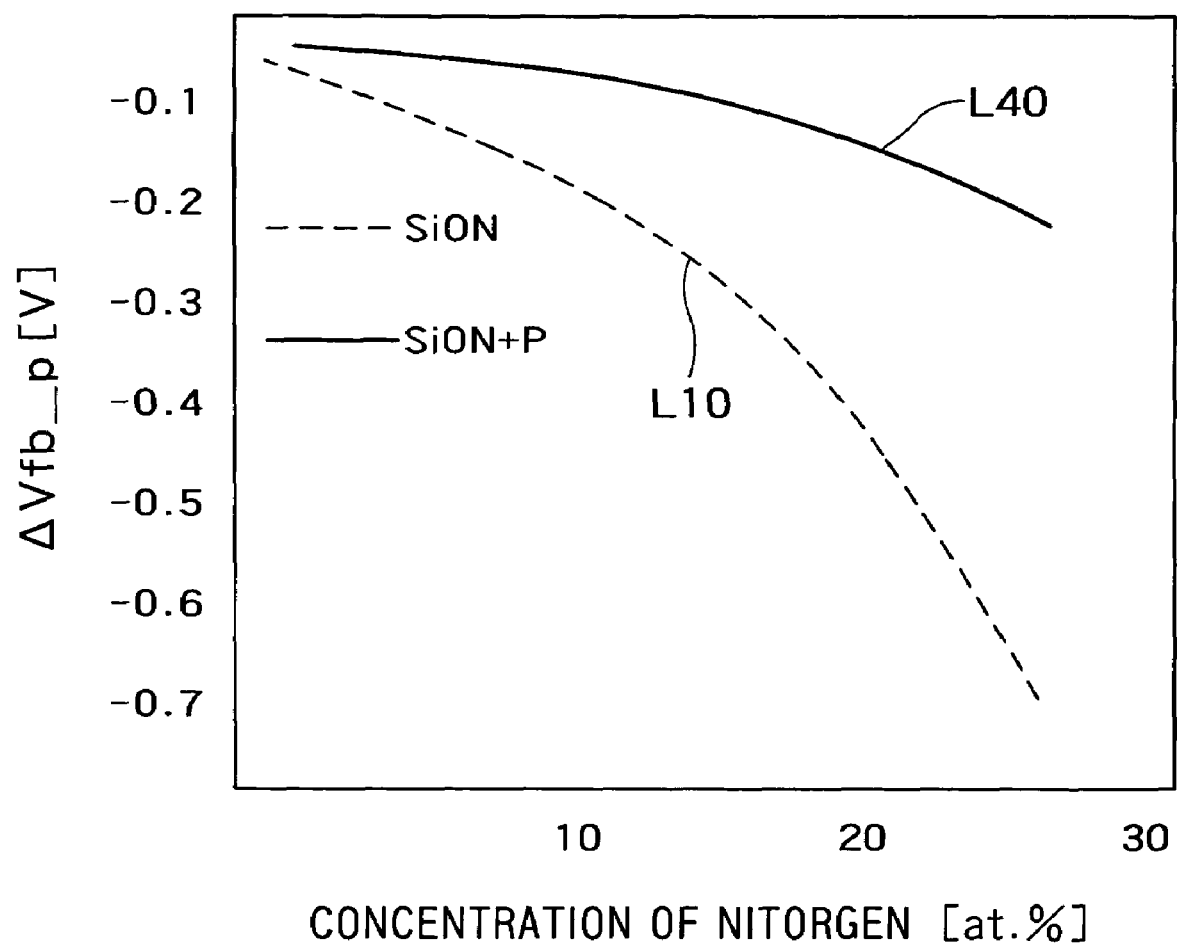
FIG. 11 is a graph showing a relationship between the concentration of nitrogen in the silicon oxynitride film 20 and a variation $\Delta Vfb$ in the flat band voltage.

FIG. 11 is a graph showing a relationship between the concentration of nitrogen in the silicon oxynitride film 20 and a variation ΔVfb in the flat band voltage. The curve L10 expresses a concentration of nitrogen when a conventional silicon oxynitride film is used. A curve L40 expresses a concentration of nitrogen when a silicon oxynitride film having the interface 40 containing carbon is used. The physical film thickness of the silicon oxynitride films corresponding to the curves L10 and L40, respectively is 1.6 nm. The curve L40 shows a characteristic of the transistor according to the second embodiment.

It is clear from the curve L40 that even when the concentration of nitrogen in the silicon oxynitride film 20 is increased, the flat band voltage Vfb stays relatively stably. The reason for this is that because boron is bonded with carbon contained in the interface 40, the diffusion of boron to the silicon oxynitride film 20 is suppressed. Accordingly, the concentration of nitrogen in the silicon oxynitride film 20 can be increased further.

According to the second embodiment, carbon is deposited together with polysilicon on the surface of the silicon oxynitride film 20 at step S62. Alternatively, carbon ions can be implanted after the polysilicon film 30 is formed at step S62. Alternatively, carbon ions can be implanted into the polysilicon film 30 after step S64, and thereafter, boron ions can be further implanted into the polysilicon film 30 at step S80.

According to the second embodiment, boron is ion implanted into the polysilicon film 30 (see step S80). Alternatively, boron can be contained in the deposition gas for depositing polysilicon at step S64, resulting in that the polysilicon film 30 including boron may be grown by vapor phase epitaxy.

According to the second embodiment, when carbon and boron are bonded, this bond (the B—C bond) functions as an acceptor. Therefore, no electric inactivation is generated. This makes it possible to decrease boron at the interface between the gate insulation film 20 and the gate electrode 30, and suppress expansion of a depleted layer to the gate electrode 30.

Conventionally, when the thickness of the gate insulation film 20 is decreased, boron diffuses into the gate insulation film. Accordingly, the gate electrode 30 is depleted, and the EOT of the gate insulation film 20 is increased.

According to the second embodiment, carbon suppresses the diffusion of boron, and furthermore, the B—C bond suppresses the electric inactivation within the gate electrode 30. Consequently, according to the second embodiment, reliability can be increased and, at the same time, the EOT can be made remarkably thin.

While the binding energy of boron and phosphorus is about 1.27 eV (3.88 eV−2.61 eV=1.27 eV), the binding energy of boron and carbon is about 2.06 eV (4.67 eV−2.61 eV=2.06 eV). Therefore, the binding strength of boron and carbon is larger than the binding strength of boron and phosphorus. This means that, according to the second embodiment, the diffusion of boron can be suppressed more effectively.

The second embodiment has the effect similar to that of the first embodiment. In other words, carbon that is introduced in the interface 40 between the gate insulation film 20 and the gate electrode 30 suppresses the diffusion of boron from the gate electrode 30 to the gate insulation film 20. Accordingly, a variation in the flat band voltage Vfb and a variation in the threshold voltage Vth can be suppressed. Accordingly, the transistor can have a highly reliable and stable characteristic.

In the above embodiments, P-type MOSFETs are taken up as examples. However, the present invention can be applied to not only P-type MOSFETs but also all elements having a P-type electrode. For example, the present invention can be applied to CMOSFET (Comlementary MOSFET).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A semiconductor device comprising:
a semiconductor substrate;
an insulation film provided on the semiconductor substrate; and
an electrode provided on the insulation film, and containing boron and a semiconductor material, wherein
at least one element of the group of phosphorous, arsenic, antimony, or bismuth, or a combination of two or more kinds of elements of the group, is included at an interface between the insulation film and the electrode and is included inside of the insulation film and the electrode themselves.

2. The semiconductor device according to claim 1, wherein at least one element of the group is introduced into the interface between the insulation film and the electrode in a concentration equal to or higher than $10^{18}$ cm$^{-3}$.

3. The semiconductor device according to claim 1, wherein the insulation film contains at least one element of nitrogen, oxygen, transition element and rare earth element.

4. The semiconductor device according to claim 1, wherein the insulation film functions as a gate insulation film, and the electrode functions as a gate electrode.

5. The semiconductor device according to claim 1, wherein the semiconductor substrate is a silicon substrate,
the insulation film is a silicon oxynitride film, and
the electrode is a polysilicon electrode containing boron as an impurity.

6. The semiconductor device according to claim 1, wherein the semiconductor device is a P-conductivity type MOSFET.

7. The semiconductor device according to claim 1, wherein the electrode is a P-conductivity type electrode.

8. The semiconductor device according to claim 1, wherein the semiconductor device is CMOSFET.

9. The semiconductor device according to claim 1, wherein the semiconductor substrate is SOI.

10. The semiconductor device according to claim 1, wherein
the insulation film includes hafnium, silicon, oxygen and nitrogen.

11. The semiconductor device according to claim 1, wherein
the insulation film includes lanthanum and oxygen.

* * * * *